(12) United States Patent
Cannara et al.

(10) Patent No.: US 7,452,570 B1
(45) Date of Patent: Nov. 18, 2008

(54) PROBE-BASED LITHOGRAPHY UTILIZING THERMOMECHANICALLY ACTIVATED POLYMERS

(75) Inventors: Rachel Cannara, Adliswil (CH); Bernd W. Gotsmann, Horgen (CH); Urs T. Duerig, Rueschlikon (CH); Harish Bhaskaran, Thalwil (CH); Armin W. Knoll, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/100,354

(22) Filed: Apr. 9, 2008

(51) Int. Cl.
*B05D 5/12* (2006.01)
*B05D 1/26* (2006.01)

(52) U.S. Cl. ..................... 427/258; 427/97.3
(58) Field of Classification Search ............... 427/96.1, 427/97.3, 98.4, 98.9, 258, 266, 288, 337, 427/343
See application file for complete search history.

(56) References Cited

U.S. PATENT DOCUMENTS

| | | | |
|---|---|---|---|
| 6,573,020 B1 | 6/2003 | Hanemann et al. | |
| 6,647,766 B2 | 11/2003 | Despont et al. | |
| 6,680,808 B2 | 1/2004 | Allenspach et al. | |
| 6,989,428 B1 | 1/2006 | Bianconi et al. | |
| 7,273,636 B2 * | 9/2007 | Mirkin et al. | 427/256 |
| 2004/0010108 A1 | 1/2004 | Bianconi et al. | |
| 2006/0040057 A1* | 2/2006 | Sheehan et al. | 427/256 |
| 2008/0044575 A1* | 2/2008 | Mirkin et al. | 427/256 |

* cited by examiner

*Primary Examiner*—Frederick J Parker
(74) *Attorney, Agent, or Firm*—Carpenter & Assoc.; Robert K. Carpenter

(57) ABSTRACT

Probe-based lithography, including: depositing a preceramic polymer on a substrate; writing nanoscale features in the polymer by locally transforming the preceramic polymer via a chemical reaction causing it to undergo a permanent phase change into hardened, ceramic material, the chemical reaction activated with a prescribed activation energy supplied by heat and/or pressure applied by a probe tip; then depositing new layers and continuing according to a desired three-dimensional pattern; either by (a) removing unactivated preceramic polymer utilizing a removal solvent, or (b) cross-linking unactivated preceramic polymer to act as a support medium that isolates a formed ceramic structure mechanically and/or electrically; and where the ceramic pattern is made electrically conductive by (a) incorporating dopant elements into or onto the preceramic polymer, or (b) performing the write step in a chemically-active environment that supplies dopant atoms during the chemical reaction.

1 Claim, 2 Drawing Sheets

US 7,452,570 B1

PROBE-BASED LITHOGRAPHY UTILIZING THERMOMECHANICALLY ACTIVATED POLYMERS

CROSS-REFERENCE TO RELATED APPLICATIONS (Not Applicable)

Figure 1:
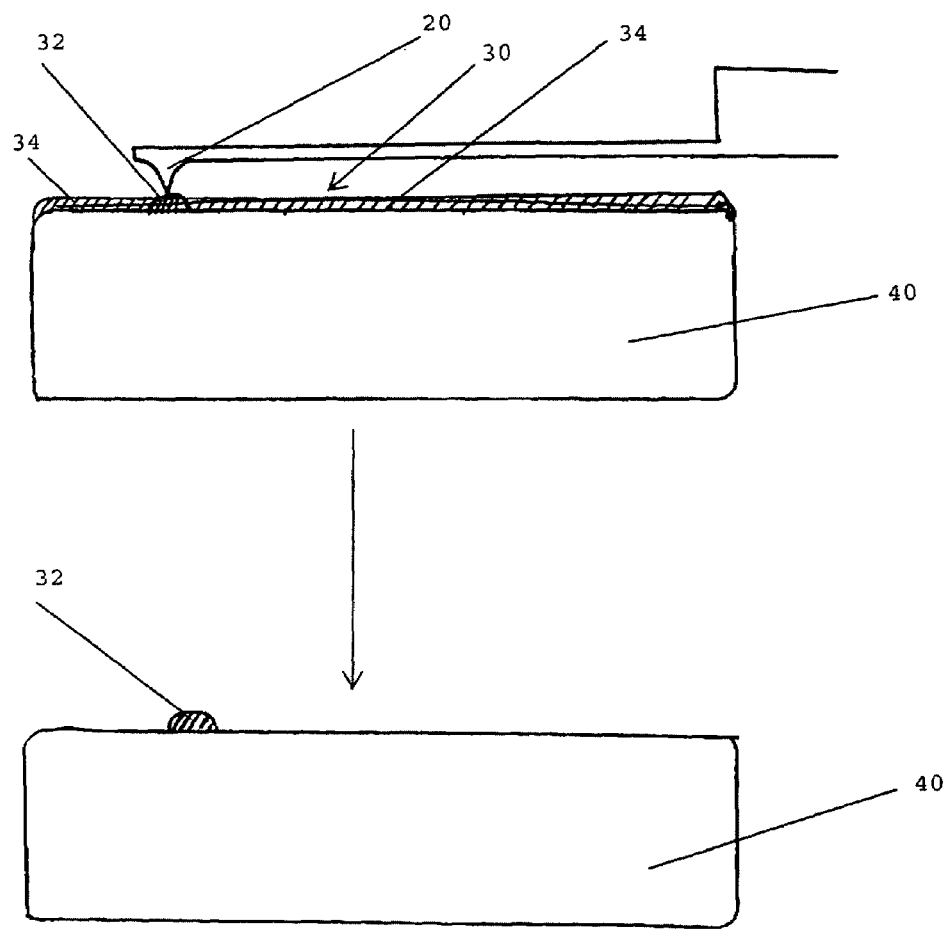

STATEMENT REGARDING FEDERALLY SPONSORED RESEARCH OR DEVELOPMENT (Not Applicable)

THE NAMES OF THE PARTY TO A JOINT RESEARCH AGREEMENT (Not Applicable)

INCORPORATION-BY-REFERENCE OF MATERIAL SUBMITTED ON A COMPACT DISC (Not Applicable)

BACKGROUND OF THE INVENTION (1) Field of the Invention

This disclosure is directed to a method and apparatus for probe-based lithography using thermomechanically activated polymers.

(2) Description of Related Art Including Information Submitted under 37 CFR 1.97 and 1.98

Allenspach et al. (U.S. Pat. No. 6,680,808) is representative of a magnetic millipede for ultra high density magnetic storage. According to the Allenspach et al. abstract, "a two-dimensional array of cantilevered tips . . . is advantageously used in an inventional storage system each of which tips serves as a heat source when it is activated by a current flowing through a resistive path within said tip . . . ."

Sheehan et al. (U.S. Published Patent Application No. 2006/0040057) discloses, in the abstract, "an apparatus for nanolithography and a process for thermally controlling the deposition of a solid organic 'ink' from the tip of an atomic force microscope to a substrate."

Hanemann et al. (U.S. Pat. No. 6,573,020) discloses that in "a method for the manufacture, by means of lithography, of ceramic small and micro-parts, a pre-ceramic silicon containing polymer layer is deposited on a highly temperature resistant substrate and then dried at room temperature. The layer is then exposed in an image pattern to electromagnetic radiation and the exposed layer is developed in an organic solvent to remove the non-exposed areas."

Bianconi et al. (U.S. Pat. No. 6,989,428) discloses "silicon carbide (SiC) ceramics that can be produced from poly(methylsilyne), as well as other ceramics, which can be produced from these precursors" (see the Bianconi et al. abstract). Also see U.S. Patent Publication No. 2004/0010108 to Bianconi et al.

BRIEF SUMMARY OF THE INVENTION

At least some aspects of this disclosure are directed to a method and apparatus for generating silicon carbide lithographic features by thermomechanically activating a precursor polymer.

In particular, at least some aspects of this disclosure are directed to a method of probe-based lithography, including: depositing a preceramic polymer on a substrate; writing nanoscale features in the preceramic polymer by locally transforming the preceramic polymer via a chemical reaction causing it to undergo a permanent phase change into a hardened, ceramic material, where the chemical reaction is activated with a prescribed activation energy supplied by heat and/or pressure applied by a nanoscale probe tip; then depositing new layers of preceramic polymer and continuing according to a desired three-dimensional ceramic pattern; either by (a) removing unactivated preceramic polymer utilizing a removal solvent, or (b) cross-linking (e.g., by UV radiation, heat, etc,) unactivated preceramic polymer to act as a support medium that isolates a formed ceramic structure both mechanically and electrically; and where the ceramic pattern is made electrically conductive either by (a) incorporating dopant elements into or onto the preceramic polymer, or (b) performing the write step in a chemically-active (e.g., $NH_3$) environment that supplies dopant atoms during the chemical reaction.

At least some other aspects and embodiments of this disclosure are directed to a device having features formed thereon according to a method in accordance with aspects of this disclosure and an apparatus for making such features.

Other exemplary embodiments and advantages of this disclosure can be ascertained by reviewing the present disclosure and the accompanying drawings.

BRIEF DESCRIPTION OF THE SEVERAL VIEWS OF THE DRAWING(S)

Figure 2:
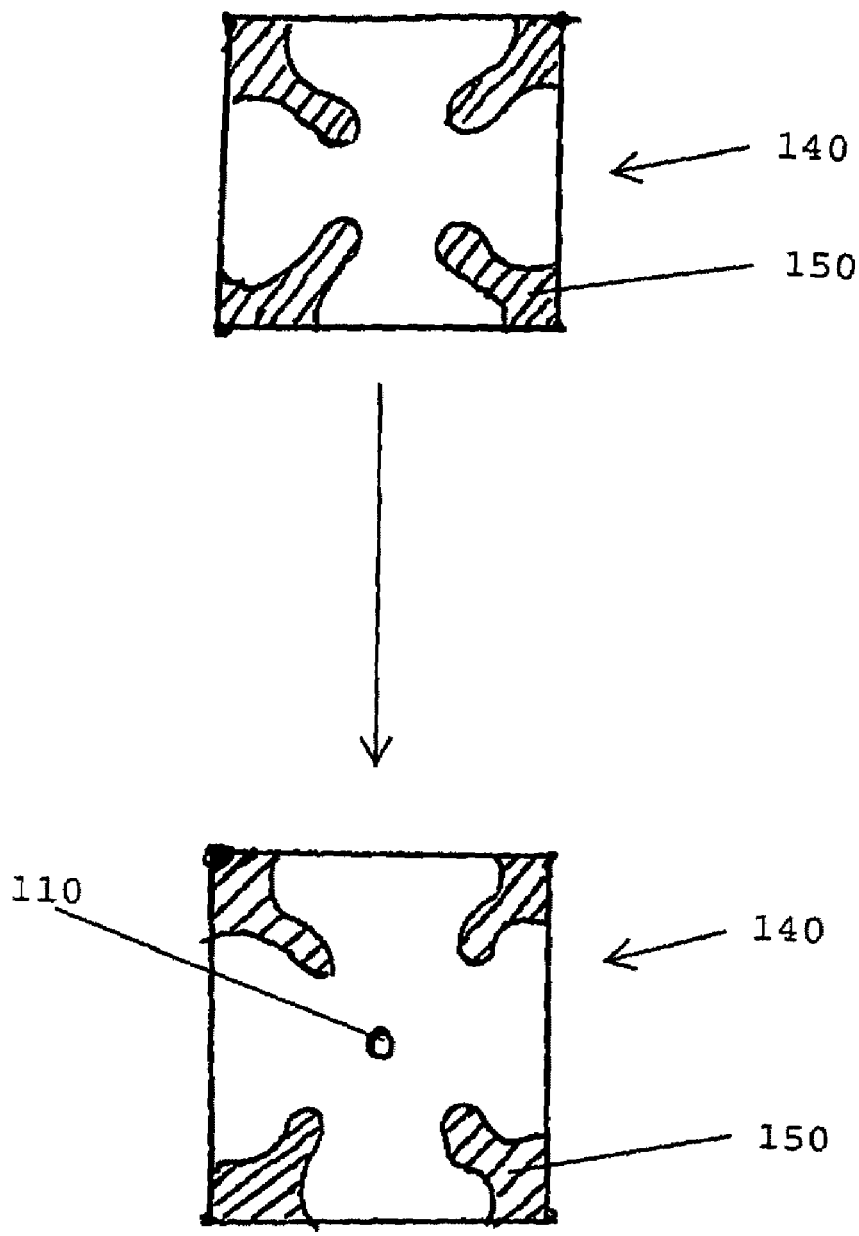

This disclosure is further described in the detailed description that follows, with reference to the drawings, in which:

FIG. 1 illustrates an embodiment where a combination of heat and/or pressure is applied at a particular location to thermomechanically form a permanent material in accordance with aspects and embodiments of this disclosure; and FIG. 2 illustrates an embodiment where a quantum dot is formed by thermal activation of the polymer after large-scale lithography defines non-critical passive components (electrodes, inductors, transmission lines etc.).

DETAILED DESCRIPTION OF THE INVENTION

Exemplary embodiments of this disclosure are described herein by way of example.

Probe-based lithography is a known but developing methodology for which the state-of-the-art is unsuited to large scale lithography. This is due to the fact that much of this method is based on physically removing parts of the masking polymers (e.g., by scratching a polymer). This process results in excessive tip wear and variations in lithographic features due to variable tip geometry and media inhomogeneity. Thus, a reliable technique to utilize probe-based lithography would be beneficial as an alternative mode of writing small-scale features.

Thermomechanically-activated polymers can be suited to nanolithography for several reasons. A local transformation approach can be applied for writing nanoscale features (e.g., wires, dots, etc.) on preceramic polymer surfaces, followed by depositing new layers of polymer on top and continuing the write process according to a desired three-dimensional pattern. The patterned ceramic can be made electrically conductive either by incorporating dopant elements into the polymer or by performing the write step in a chemically-active environment, such as ammonia ($NH_3$). Dopants may also be introduced by writing the dopant material (as in dip-pen lithography) onto the surface of the preceramic polymer before or during the write process.

Since physical removal of the material is not required during the activation process, wear of the tip used for writing structures may not be a serious issue for such lithography.

Further, one can perform thermal imaging (using the same tip as a probe) of the surface to align to existing features precisely, satisfying another critical requirement to be feasible for accurate large scale lithography. Such a method can be readily combined with large area lithography. For example, large areas can be quickly and easily fabricated using standard lithography. Then, for masking smaller feature sizes at the same mask level, one can incorporate this method to selectively form masking or functional permanent material (e.g., silicon carbide from PMSy, where the wide bandgap and structural properties of silicon carbide can make it a desirable material for nanoscale electromechanical devices). For instance, the electrodes that control the energy levels of a quantum dot can be patterned, followed by formation of a silicon carbide quantum dot in the area of interest. This particular feature of this method can be especially useful, because many of the current methods require a combination of complicated, and oftentimes subjective, polymer chemistry and double exposures that can have poor yields and can require operator supervision.

In addition, the polymer can be removed quickly and easily utilizing the appropriate solvent, if a free-standing structure is desired. Otherwise, the polymer can be cross-linked by any amount to act as a support medium that isolates the ceramic structures both mechanically and electrically.

FIG. 1 illustrates an exemplary embodiment of this technique, wherein a combination of heat and/or pressure is applied by a probe tip at a particular location on a ceramic precursor 30, that is on a substrate 40 to thermomechanically form a permanent material 32. The non-activated material 34, if desired, can then be dissolved in an appropriate solvent. This can also be performed in a stacked manner (e.g., pattern one polymer layer, spin coat a second layer prior to removing unactivated polymer of the first layer, pattern this second layer, and so on) to produce 3-D structures.

FIG. 2 illustrates another exemplary embodiment where a quantum dot 110 is formed on a device 140 by thermal activation of a polymer after large-scale lithography defines non-critical passive components 150 (electrodes, inductors, transmission lines etc.).

In embodiments of this disclosure, the structures such as a quantum dot 110 are formed in a preceramic polymer (or polymer precursor) via a chemical reaction that transforms the polymer into a hardened, ceramic material (the process referred to as "thermolysis" or "pyrolysis"). This process is not dominated by the deformation mechanics of the polymer, but instead by a chemical reaction with a prescribed activation energy that can be supplied by the heat and/or pressure applied by the nanoscale probe tip 20.

Since the reaction results in a permanent phase change of the material (transforming the relatively soft polymer toward a ceramic state of variable stoichiometry), the features such as a quantum dot 110 are also permanent.

Polymethylsilyne (PMSy), $[(CH_3)SiH]_n$, is a high molecular weight preceramic polymer that forms silicon carbide in inert (e.g., argon) or chemically-active (e.g., ammonia) environments at temperatures above 200° C. and a pressure of 1 atm or above. PMSy was discovered recently to be a superior polymer precursor for silicon carbide materials, due to its high yield (of SiC from polymer) and its production of near-stoichiometric, defect-free SiC.

Alternatively, the preceramic polymer can be deposited from a plasma. The monomers utilized for plasma deposition can be chosen, for example, from methylene, acetylene, and silane. By adjusting the plasma deposition parameters, namely the power to heat the plasma in a microwave of RF-plasma source, the degree of cross-linking of the prepolymer can be adjusted.

The film can subsequently be indented by a probe tip 20, converting the polymer precursor to a ceramic, and forming a stable feature such as a quantum dot 110.

Depending on the molecular content of the surrounding atmosphere, the indentation process can be tailored to produce a conducting silicon carbide material (e.g., N-doped SiC is produced by thermolysis of PMSy in an $NH_3$ environment). For the case of the plasma deposited polymer, N-doping can be obtained by adding corresponding nitrogen containing monomers to the plasma.

The foregoing exemplary embodiments have been provided for the purpose of explanation and are in no way to be construed as limiting this disclosure. This disclosure is not limited to the particulars disclosed herein, but extends to all embodiments within the scope of the appended claims, and any equivalents thereof.

The invention claimed is:

1. A method of probe-based lithography, comprising:
   depositing a preceramic polymer on a substrate;
   writing nanoscale features in the preceramic polymer by locally transforming the preceramic polymer via a chemical reaction causing it to undergo a permanent phase change into a hardened ceramic material, wherein the chemical reaction is activated by heat and/or pressure applied by a nanoscale probe tip;
   then depositing new layers of preceramic polymer and repeating the writing on the new layers to form to a desired three-dimensional ceramic electrically conductive pattern;
   treating the deposited layers by (a) removing unactivated preceramic polymer utilizing a removal solvent, or (b) cross-linking unactivated preceramic polymer to act as a support medium that isolates a formed ceramic structure both mechanically and electrically; and
   wherein the ceramic pattern is made electrically conductive either by (a) incorporating dopant elements into or onto the preceramic polymer, or (b) performing the writing step in a chemically-active atmosphere that supplies dopant atoms during the chemical reaction.

* * * * *